(12) United States Patent
Belcourt et al.

(10) Patent No.: US 11,056,168 B2
(45) Date of Patent: Jul. 6, 2021

(54) TEMPERATURE COMPENSATED MEMORY REFRESH

(71) Applicant: Panasonic Automotive Systems Company of America, division of Panasonic Corporation of North America, Peachtree City, GA (US)

(72) Inventors: David Luc Belcourt, Peachtree City, GA (US); Shivaramraje Nimbalkar, Peachtree City, GA (US); Vishnuchakravarthi Nagarajan, Peachtree City, GA (US)

(73) Assignee: Panasonic Automotive Systems Company of America, Division of Panasonic Corporation of North America, Peachtree City, GA (US)

( * ) Notice: Subject to any disclaimer, the term of this patent is extended or adjusted under 35 U.S.C. 154(b) by 0 days.

(21) Appl. No.: 16/506,118

(22) Filed: Jul. 9, 2019

(65) Prior Publication Data
US 2020/0058348 A1     Feb. 20, 2020

Related U.S. Application Data

(60) Provisional application No. 62/718,673, filed on Aug. 14, 2018.

(51) Int. Cl.
*G11C 11/406* (2006.01)
*G06F 3/06* (2006.01)
*G06F 12/02* (2006.01)

(52) U.S. Cl.
CPC ........ *G11C 11/40626* (2013.01); *G06F 3/064* (2013.01); *G06F 3/0607* (2013.01); *G06F 3/0658* (2013.01); *G06F 3/0679* (2013.01); *G06F 12/0246* (2013.01); *G11C 11/40618* (2013.01)

(58) Field of Classification Search
CPC ....................................................... G11C 7/04
USPC .............................................................. 365/222
See application file for complete search history.

(56) References Cited

U.S. PATENT DOCUMENTS

| | | | |
|---|---|---|---|
| 9,857,978 B1* | 1/2018 | Griffin | G06F 3/0604 |
| 2006/0056251 A1* | 3/2006 | Parkinson | G11C 13/0004 365/202 |
| 2013/0293506 A1* | 11/2013 | El-Khaled | G01C 21/3664 345/174 |
| 2018/0197599 A1* | 7/2018 | Choi | G11C 11/4078 |
| 2019/0035276 A1* | 1/2019 | Zruya | G06K 9/00825 |
| 2019/0161341 A1* | 5/2019 | Howe | B81B 7/0087 |
| 2019/0203622 A1* | 7/2019 | Haruguchi | F01N 3/0885 |
| 2019/0378565 A1* | 12/2019 | Yuan | G11C 7/04 |

* cited by examiner

*Primary Examiner* — Min Huang
(74) *Attorney, Agent, or Firm* — Laurernce S. Roach, Esq.

(57) ABSTRACT

Examples of the present disclosure relate to a device, method, and medium storing instructions for execution by a processor for refreshing memory blocks of solid state memory through a temperature compensated refresh rate. Techniques discussed herein include a solid state memory to store data and a temperature sensor to identify a temperature of the solid state memory. The memory device with solid state memory also includes a memory controller that periodically refreshes memory blocks of the solid state memory at an adjustable refresh rate, wherein memory controller is to adjust the adjustable refresh rate based on the temperature of the solid state memory.

18 Claims, 5 Drawing Sheets

TEMPERATURE COMPENSATED MEMORY REFRESH

CROSS-REFERENCE TO RELATED APPLICATIONS

This application claims the benefit of U.S. Provisional Application No. 62/718,673, filed on Aug. 14, 2018, which the disclosure of which is hereby incorporated by reference in its entirety for all purposes.

FIELD OF THE INVENTION

The present disclosure generally relates to a method, system, and device for temperature compensated memory refresh rate. More specifically, the present disclosure relates to adjusting a refresh rate in memory devices such as NAND memory using a temperature as a factor in determining the refresh rate.

BACKGROUND

This section is intended to introduce the reader to various aspects of art, which may be related to various aspects of the present disclosure, which are described and/or claimed below. This discussion is believed to be helpful in providing the reader with background information to facilitate a better understanding of the various aspects of the present disclosure. Accordingly, it can be understood that these statements are to be read in this light, and not as admissions of prior art.

In solid state memory drives, particularly NAND memory can experience memory degradation every time memory content is changed and also as a function of time. This can be seen generally as manufacturers of many solid state drives or NAND memory devices guarantee the memory they manufacture for a limited period of time such as a single year. Memory content can be changed due to program and erase (P/E) cycling. Exceeding the P/E cycling limits set by the manufacturer can degrade the ability of the memory to retain the stored information.

SUMMARY

Generally, the present techniques relate to a memory device with a temperature compensated refresh rate. The memory device can include a solid state memory to store data and a temperature sensor to identify a temperature of the solid state memory. The memory device can also include a memory controller that periodically refreshes memory blocks of the solid state memory at an adjustable refresh rate, wherein memory controller is to adjust the adjustable refresh rate based on the temperature of the solid state memory.

The present techniques further include a method for maintaining data through a temperature compensated refresh rate including identifying an initial refresh rate of a solid state memory and identifying a temperature of the solid state memory. The method also includes modifying the initial refresh rate based on the temperature identified and refreshing the solid state memory at a time determined by the refresh rate.

The present techniques also include a tangible, non-transitory, computer-readable medium that can include instructions that, when executed by a processor, direct the processor to refresh memory blocks of a solid state drive using a temperature compensated refresh rate. The instructions to direct the processor to identify a temperature of a solid state memory and modify an adjustable refresh rate of the solid state memory based on the temperature identified. The instructions further may refresh memory blocks of the solid state memory at a time determined by the adjustable refresh rate.

BRIEF DESCRIPTION OF THE DRAWINGS

The above-mentioned and other features and advantages of the present disclosure, and the manner of attaining them, may become apparent and be better understood by reference to the following description of one example of the disclosure in conjunction with the accompanying drawings, where.

Figure 1:
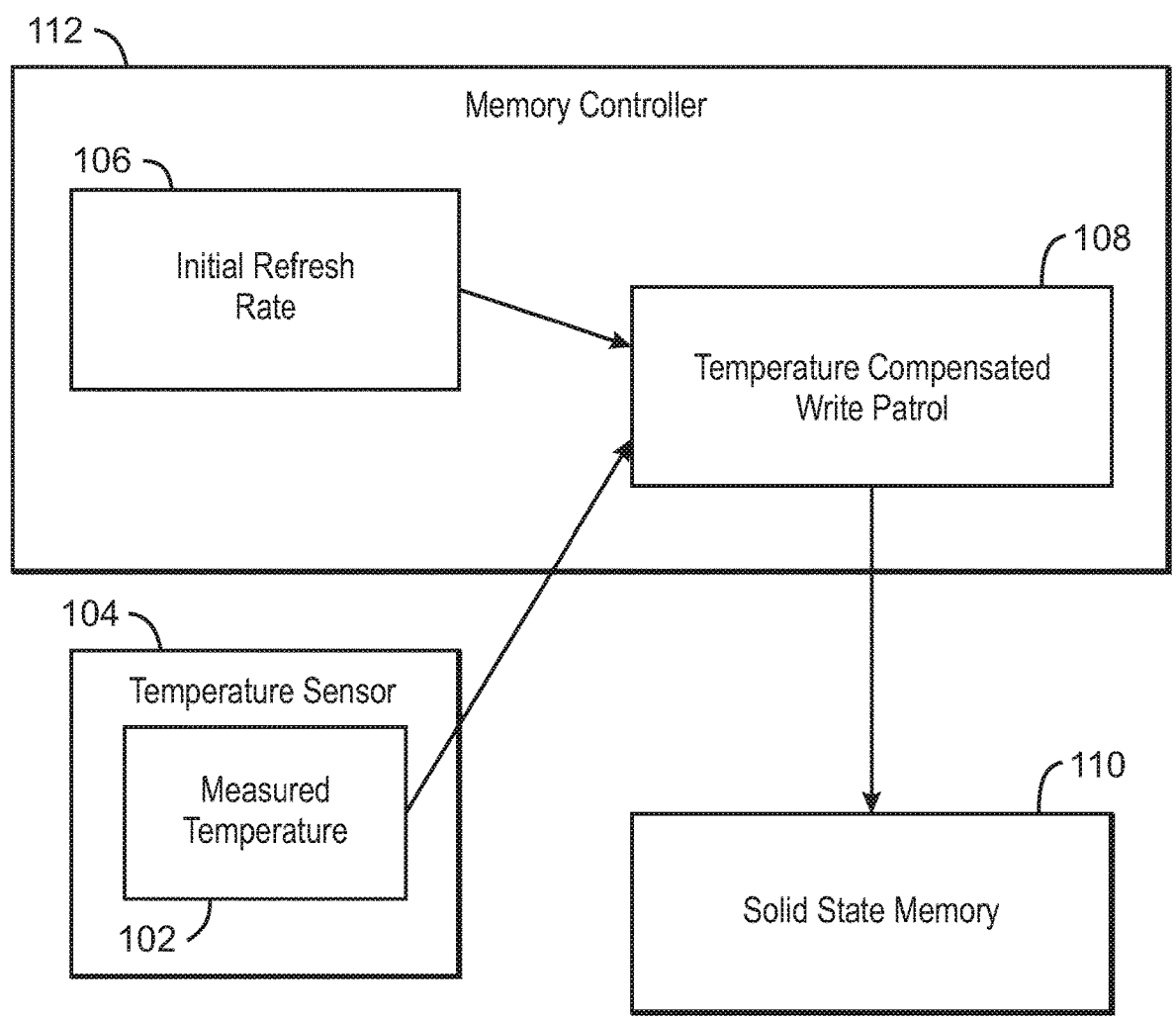
FIG. 1 is a block diagram of an example system for applying a temperature compensated write patrol.

Correlating reference characters indicate correlating parts throughout the several views. The exemplifications set out herein illustrate examples of the disclosure, in one form, and such exemplifications are not to be construed as limiting in any manner the scope of the disclosure.

DETAILED DESCRIPTION OF EXAMPLES

One or more specific examples of the present disclosure are described below. In an effort to provide a concise description of these examples, not all features of an actual implementation are described in the specification. It can be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it can be appreciated that such a development effort might be complex and time consuming, and is a routine undertaking of design, fabrication, and manufacture for those of ordinary skill having the benefit of this disclosure.

The present disclosure describes a temperature compensated memory refresh for preserving data in a memory device such as solid state memory. The program and erase (P/E) cycling where individual memory cells get worn out each time the memory content is changed can contribute to wear and tear on memory eventually leading to memory and data degradation and loss. Exceeding a set P/E cycling limit for a memory device can degrade the ability of the memory to retain the stored information. The set P/E cycling limit can be determined by a manufacturer. A second factor of data degradation in memory devices is time itself. The retention time of data can also be a factor of the device temperature where increased temperature has been shown to degrade memory retention in solid state drives, flash memory, NAND memory and other similar memory that relies on components that store a charge. Accordingly, devices that operate under different temperatures have varied retention times depending on the operating condition over time. Memory locations that are seldom written to but are read frequently have an increased risk as the reading can wear down the integrity of data eventually rendering the location unreadable if no intervening action is taken. This result can be called read-disturb. Read disturb can also refer to the reading of cells causing nearby cells in the same memory block to change over time. Each of these issues may be addressed by refreshing the memory block or by taking other corrective action. This corrective action may be referred to herein as write patrol.

FIG. 1 is a block diagram of an example system 100 for applying a temperature compensated write patrol. A measured temperature 102 and initial refresh rate 106 may be used in the generation of a temperature compensated write patrol 108 for refreshing a solid state memory 110 via a memory controller 112. As used herein, the measured temperature 102 may refer to the measurement of temperature of the solid state memory 110. The retention time of data in a solid state memory 110 is a factor of the device temperature. In particular, in devices that operate under different temperatures the retention time of data can vary depending on the operating condition over time. Data stored in memory that seldom goes through any program and erase cycles (P/E cycles) can be refreshed through specific instructions to be refreshed for data preservation rather than for use of data by other applications or processes with access to the solid state memory. As the process of reading and rewriting the memory allows the data to be refreshed and resets of the data retention time, software can be programed to refresh memory through read and rewrite cycles within a given time period to minimize the risk of data lost. This process or software for refreshing the data in a solid state memory can be referred to as write patrol. The rate at which the write patrol operates can be understood as refresh rate, and an initial refresh rate 106 can be set by a manufacturer of the solid state memory. The measured temperature 102 and the initial refresh rate 106 can be used together to for calculating a temperature compensated write patrol 108 implemented by a memory controller 112 for the solid state memory 110. As used herein, the memory controller 112 may be a part of the memory device, such as the solid state memory 110 or may be separate with access and control of the solid state memory 110. The memory controller 112 may store information such as measured temperatures, estimated temperatures, write patrols, refresh rates, all of which may be measured, received, or estimated in order to control 112 the refresh of memory blocks in the solid state memory 110. In an example, if the measured temperature increases, the temperature compensated write patrol 108 can increase its refresh rate as well. Conversely the temperature compensated write patrol 108 can decrease its refresh rate by modifying the initial refresh rate 106 when the measured temperature 102 is lower than a previous measurement. As used herein, the measured temperature 102 may be identified by a temperature sensor 104. In an example, the temperature sensor 104 can be a digital or analog thermometer or other suitable means of measuring a temperature of a solid state memory.

Figure 2:
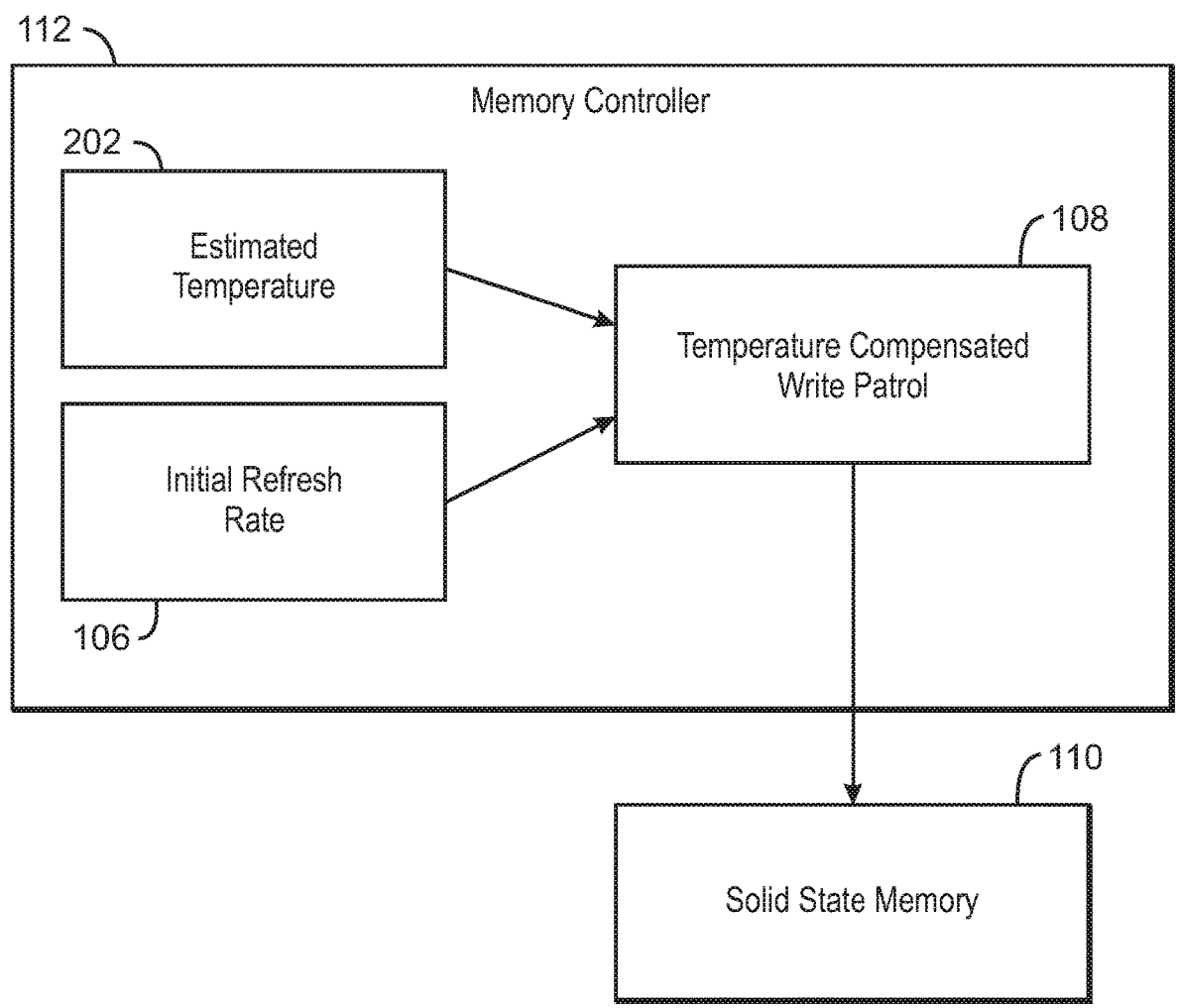
FIG. 2 is a block diagram of an example system for applying a temperature compensated write patrol based on an estimated temperature.

FIG. 2 is a block diagram of an example system 200 for applying a temperature compensated write patrol based on an estimated temperature. Like numbered items are as described for FIG. 1.

The estimated temperature 202 used can be approximated based on a previous temperature measurement, a cooling rate of a material in the solid state memory 110, and the amount of time that has passed since the last measurement of temperature and usage of the solid state memory 110. As used herein, estimated temperature may be stored or received by a memory controller and used in adjusting a refresh rate of the write patrol. In an example, the estimated temperature measurement may be based on a global temperature value stored with other devices the solid state memory 110 is integrated with. In an example, in the context of a vehicle, if the solid state memory 110 is located in the dashboard and electronically connected to the vehicle, a vehicle temperature sensors measurement may be substituted as an estimated temperature 202. This estimation of temperature may also make use of networked resources including internet weather website or search results. In an example, the estimation of temperature may associate the solid state memory 110 with a geographic location and then send this location to a weather website or temperature storing database through a network interface and use the returned temperature value as an estimated temperature value for the solid state memory 110. Using estimated memory can account for the estimation of a value and also the frequency of use of the solid state memory 110.

Figure 3:
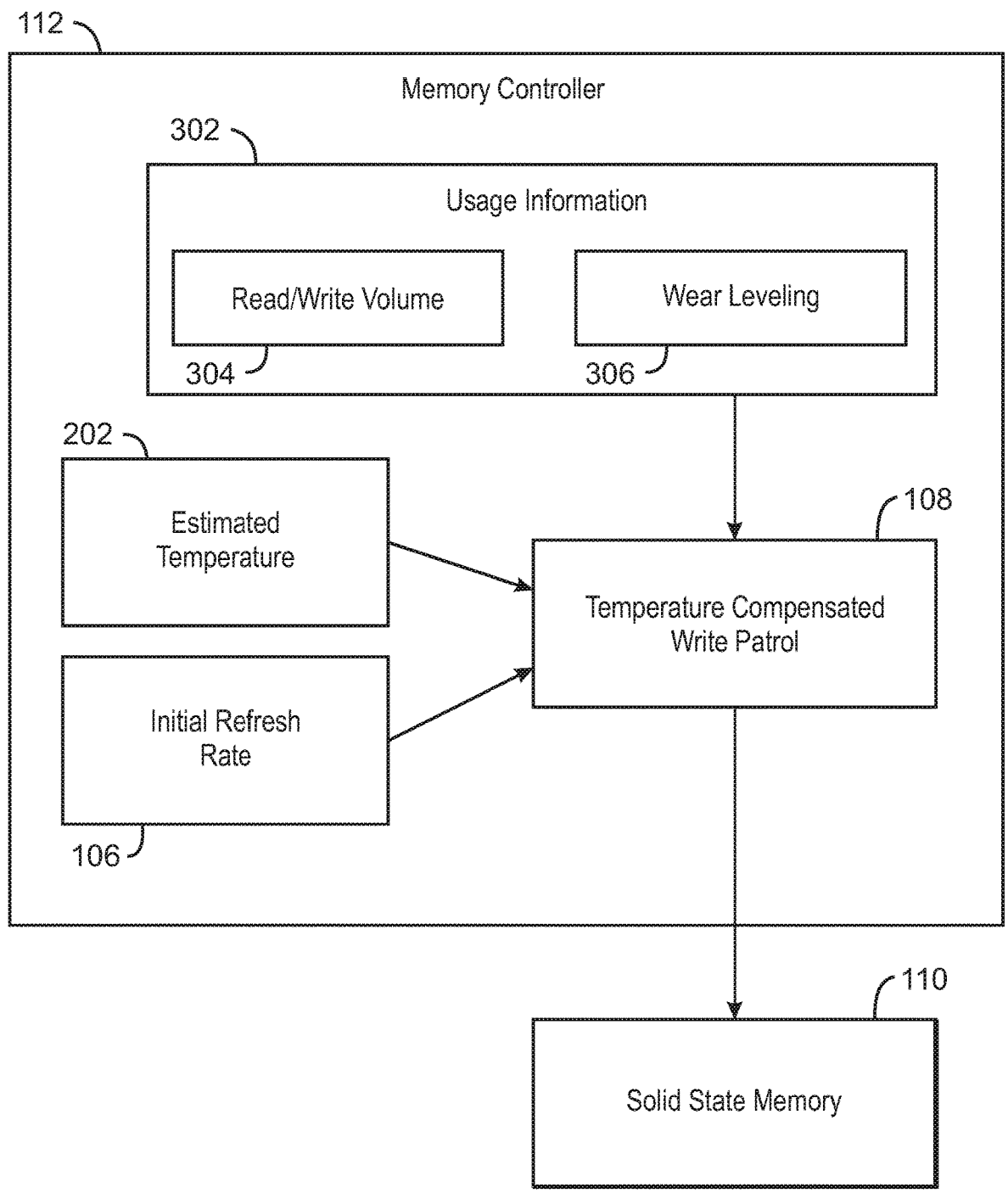
FIG. 3 is a block diagram of an example system for applying a temperature compensated write patrol based on a temperature and usage information.

FIG. 3 is a block diagram of an example system 300 for applying a temperature compensated write patrol based on a temperature and usage information. Like numbered items are as described with respect to FIGS. 1 and 2.

While an estimated temperature is shown 202, a measured temperature 106 may also be used. The generation of a temperature compensated write patrol 108 can use the estimated temperature 202, an initial refresh rate 106, and usage information 302. The usage information 302 can include any information about the usage frequency, duration, reads, writes, rewrites, or other activities undertaken by the solid state memory 110.

The usage information 302 can include read/write volume 304, which refers to the number of times a specific block of memory in the solid state memory 110 is read or written in a time frame. As used herein, the usage information may be stored, received, or utilized by a memory controller 112, or in some examples may be stored separately. A read and write transaction on a block of memory in a solid state memory 110 can be sufficient to recharge or refresh a specific block of memory. As a result, the refresh rate can be decreased based on the read/write volume. Accordingly, when determining the refresh rate for a temperature compensated write patrol 108, the frequency and volume of already occurring read/write transactions can be factored in to potentially lower the refresh rate to a level that maintains data retention while avoiding unnecessary wear and tear due to excessive rewrites of data on the solid state memory 110.

The usage information 302 can include wear leveling 306 information. Wear leveling can refer to counting the writes in a specific section of memory and remapping memory blocks to other logical and physical locations in the solid state memory in order to spread write operations between sectors of the memory. This movement and spreading around of data, similar to read/write volume, can have the same effect as a refresh, and accordingly, the amount of wear leveling that is occurring can be used to influence the refresh rate determined for the temperature compensated write patrol 108.

Figure 4:
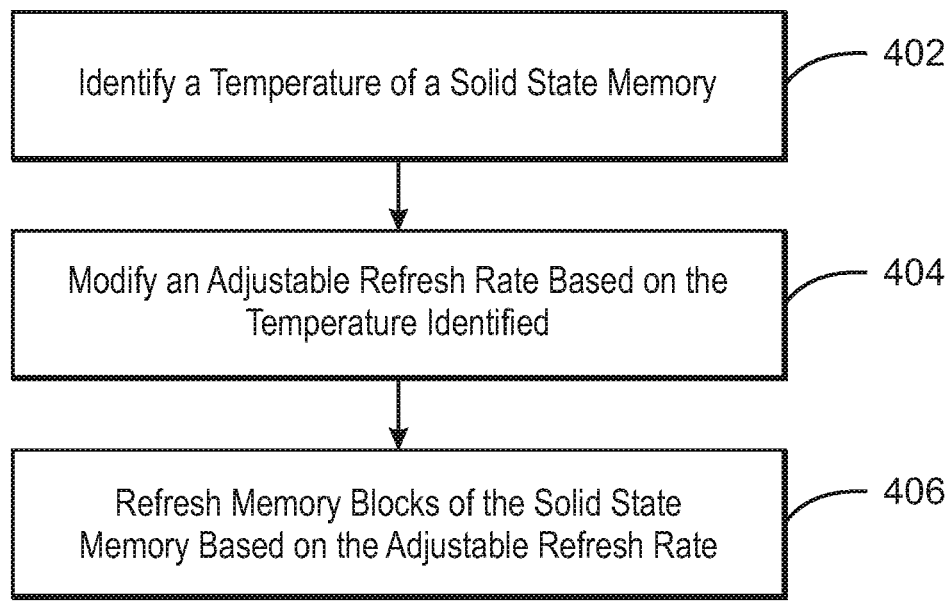
FIG. 4 is a process flow diagram of an example method for preserving data using a temperature compensated memory refresh rate.

FIG. 4 is a process flow diagram of an example method 400 for preserving data using a temperature compensated memory refresh rate. At block 402, the initial refresh rate of a solid state memory is identified. As discussed herein, an initial refresh rate can refer to a rate set by a memory manufacturer for how frequently a specific piece of memory is read and rewritten. As reading data from a memory can cause an issue known as read disturb, or over the course of time a stored charge for a specific point of memory can discharge, the rewriting of that piece of information restores the data to a new state with a new charge. The new charge can last longer than the original piece of data stored in memory would have lasted without intervention. This rewriting of information may occur at the same solid state memory location or at a different location in the solid state memory, both logically and physically. This rewriting or any other activity to restore the charge and extend the life of a piece of data in a solid state memory can be referred to as refreshing the solid state memory. The rate at which refreshing occurs can be thought of as the refresh rate. In an example, the solid state memory is a NAND solid state memory. The solid state memory may also be a solid state drive or any other type of memory that can use refreshing to restore the integrity, retention, and duration of the data.

At block 404, the temperature of the solid state memory can be identified. In an example, the temperature identifier is a temperature sensor that detects the physical property of temperature from the solid state memory. This can include thermometers that act through temperature estimation of surface temperature through infrared beams measuring the infrared radiation coming from the solid state memory. In an example, the temperature sensor may be a digital or electrical thermometer that measures temperature by electrical resistance through an item located within the solid state memory. In another example, the temperature sensor is a virtual emulation of a temperature sensor that estimates temperature of the solid state memory. As used herein, a virtual emulation of a temperature sensor is any calculated or estimated temperature that is not directly measured based on physical properties within, on, or regarding the solid state memory. Instead, an example of a virtual emulation of a temperature sensor could include a request for geographic coordinates of the solid state memory and based on this location a temperature from a weather database online could be requested. A returned temperature from a weather database, such as a website, could then be substituted as though it were measured for the solid state memory. This substitution of a temperature measurement measured external to solid state memory can be considered virtual emulation of a temperature sensor. In an example, the virtual emulation of a temperature sensor reports a temperature value obtained through an internet connection.

At block 504, the initial refresh rate is modified based on the temperature identified. As discussed herein, the increased temperature can worsen the effects of data degradation and worsen data retention. Accordingly, accounting for the temperature in order to modify the initial refresh rate allows these negative effects to be countered by increased refreshes. Further, the refreshing of the data can be dynamically affected by temperature. In an example, an initial refresh rate can be adjusted by a detected temperature in response to a detection that the temperature has changed by a threshold amount. In an example, the initial refresh rate can be modified in response to a detection that the temperature has changed by at least one degree centigrade. In an example, the initial refresh rate is modified after a set amount of time, such as 5 seconds, 10 seconds, a minute, or other suitable time frame to allow ongoing adjustment of the refresh rate. Dynamically adjusting the refresh rate can include increasing the refresh rate to avoid loss of data due to lost charge of a memory block, or decreasing the refresh rate if the number of writes and rewrites threatens to wear down a data block too soon due to overuse.

At block 506, the solid state memory is refreshed at a time determined by the refresh rate. After the rate is set, the device may enact the specific refreshing action suitable for the memory block including erasing, moving of data, rewriting of data, copying of data or any other suitable refreshing action for the intended preservation of indicated data.

The method 400 can further include modifying the refresh rate based on the temperature measured at the temperature sensor, the initial refresh rate, and a rate of data usage measured by the device. In this example, the data usage can include the read and write volume on the solid state memory. One example of the impact of read and write rates on data is that if the data usage is sufficiently frequent, there is lower risk of memory charge loss due to lack of use. Specifically, as the memory in question may already be used, this usage can be factored in when deciding whether or not to alter the refresh rate of data. In another example, the data usage may also include wear leveling information for the solid state memory. Wear leveling can refer to counting the writes in a specific section of memory and remapping memory blocks to other logical and physical locations in the solid state memory in order to spread write operations between sectors of the memory. This redistribution of data also can have the same effect as a refresh, and accordingly, the amount of wear leveling that is occurring can be used to influence the refresh rate.

The method 400 may also include increasing the refresh rate in response to a temperature that is an increase from a previous temperature measurement. The method 400 may also include decreasing the refresh rate in response to a temperature that is a decrease from a previous temperature measurement. These adjustments of a refresh rate based on the temperature of the solid state memory can correspond to the increased memory degradation that occurs in the solid state memory, such as NAND solid state memories, due to an increase in heat of the solid state memory.

Figure 5:
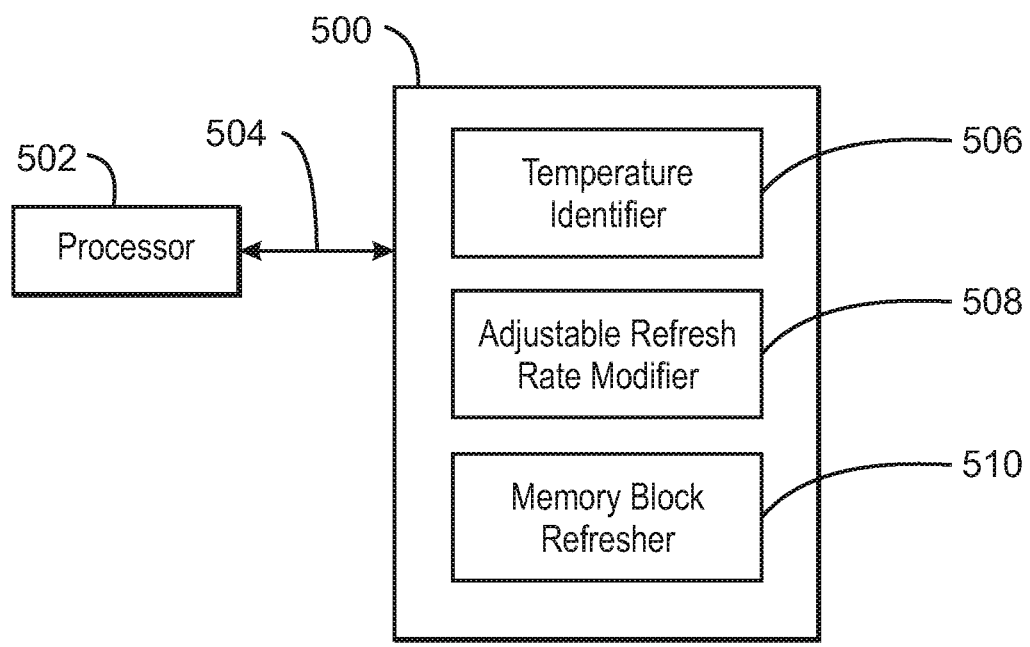
FIG. 5 is a block diagram of an example computer-readable medium storing instructions, that when executed on a processor preserves data using a temperature compensated memory refresh rate.

FIG. 5 is a drawing of an example computer-readable medium storing instructions, that when executed on a processor preserves data using a temperature compensated memory refresh rate. The tangible, non-transitory, computer-readable medium 500 includes instructions that, when executed by a processor 502 can direct the processor 502 through a bus 504 to preserve data using a temperature compensated memory refresh rate.

The computer-readable medium 500 includes instructions that when executed on a processor enact an initial refresh rate identifier 506 function to identify an initial refresh rate of a solid state memory. In an example, the solid state memory is a NAND solid state memory. The solid state memory may also be a solid state drive or any other type of memory that can use refreshing to restore the integrity, retention, and duration of the data.

The computer-readable medium 500 includes instructions that when executed on a processor enact a temperature identifier 508 function to identify a temperature of the solid state memory. In an example, the temperature identifier temperature sensor that detects the physical property of temperature from the solid state memory. In an example, the temperature sensor may be a digital or electric thermometer that measures temperature by electrical resistance through an item located within the solid state memory. In another example, the temperature sensor is a virtual emulation of a temperature sensor that estimates temperature of the solid state memory. This substitution of a temperature measurement measured external to solid state memory can be considered virtual emulation of a temperature sensor. In an example, the virtual emulation of a temperature sensor reports a temperature value obtained through an internet connection.

The computer-readable medium 500 includes instructions that when executed on a processor enact an initial refresh rate modifier 510 function to modify the initial refresh rate based on the temperature identified. The computer-readable medium 500 includes instructions that when executed on a processor enact a solid state memory refresher 512 function to refresh the solid state memory at a time determined by the refresh rate. After the rate is set, the device may enact the specific refreshing action suitable for the memory block including erasing, moving of data, rewriting of data, copying of data or any other suitable refreshing action for the intended preservation of indicated data.

In an example, the computer-readable medium 500 includes instructions that when executed on the processor 502 modifies the refresh rate based on the temperature measured at the temperature sensor, the initial refresh rate, and a rate of data usage measured by the device. In this example, the data usage includes the read and write volume on the solid state memory. One example of the impact of read and write rates on data is that if the data usage is sufficiently frequent, there is lower risk of memory charge loss due to lack of use. In another example, the data usage may also include wear leveling information for the solid state memory.

The computer-readable medium 500 may include instructions that when executed on the processor 502 cause the processor 502 to increase the refresh rate in response to a temperature that is an increase from a previous temperature measurement. The computer-readable medium 500 can include instructions that when executed, cause the processor 502 to decrease the refresh rate in response to a temperature that is a decrease from a previous temperature measurement.

What is claimed is:

1. A memory device with a temperature compensated refresh rate, comprising:
    a solid state memory, in a vehicle dashboard, to store data;
    a temperature sensor to identify a temperature of the solid state memory, wherein the temperature is estimated from a temperature value obtained from a temperature sensor of the vehicle located physically outside of the solid state memory; and
    a memory controller that periodically refreshes memory blocks of the solid state memory at an adjustable refresh rate, wherein the memory controller is to adjust the adjustable refresh rate based on the temperature of the solid state memory, wherein the adjustable refresh rate is modified based on the temperature measured at the temperature sensor, an initial refresh rate, and a rate of data usage measured by the solid state memory, and wherein the data usage comprises wear leveling information for the solid state memory.

2. The device of claim 1, wherein the data usage comprises a read and write volume on the solid state memory.

3. The device of claim 1, wherein the adjustable refresh rate is increased in response to an increased temperature from a previous temperature measurement.

4. The device of claim 1, wherein the adjustable refresh rate is decreased in response to a decreased temperature from a previous temperature measurement.

5. The device of claim 1, wherein the solid state memory is a NAND solid state memory.

6. The device of claim 5, wherein the solid state memory is a flash-based solid state memory.

7. A method for preserving data through a temperature compensated refresh rate comprising:
    identifying a temperature of a solid state memory in a vehicle dashboard;
    modifying an adjustable refresh rate of the solid state memory based on the temperature identified, wherein the temperature identified is estimated from a temperature value obtained from a temperature sensor of the vehicle located physically outside of the solid state memory; and
    refreshing memory blocks of the solid state memory at a time determined by the adjustable refresh rate, wherein the adjustable refresh rate is modified based on the temperature measured at the temperature sensor, an initial refresh rate, and a rate of data usage measured by the solid state memory, and wherein the data usage comprises wear leveling information for the solid state memory.

8. The method of claim 7, wherein the data usage comprises a read and write volume on the solid state memory.

9. The method of claim 7, comprising increasing the adjustable refresh rate in response to an identification of a temperature increase of the solid state memory from a previous temperature measurement.

10. The method of claim 7, comprising decreasing the adjustable refresh rate in response to an identification of a temperature decrease of the solid state memory from a previous temperature measurement.

11. The method of claim 7, wherein the solid state memory is a NAND solid state memory.

12. The method of claim 11, wherein the solid state memory is a flash-based solid state memory.

13. A tangible, non-transitory, computer-readable medium comprising instructions that, when executed by a processor, refreshes memory blocks of a solid state drive using a temperature compensated refresh rate, the instructions to direct the processor to:
    identify a temperature of a solid state memory in a vehicle dashboard, wherein the temperature is estimated from a temperature value obtained from a temperature sensor of the vehicle located physically outside of the solid state memory;
    modify an adjustable refresh rate of the solid state memory based on the temperature identified; and
    refresh memory blocks of the solid state memory at a time determined by the adjustable refresh rate, wherein the adjustable refresh rate is modified based on the temperature measured at the temperature sensor, an initial refresh rate, and a rate of data usage measured by the solid state memory, and wherein the data usage comprises wear leveling information for the solid state memory.

14. The computer-readable medium of claim 13, wherein the data usage comprises a read and write volume on the solid state memory.

15. The computer-readable medium of claim 13, comprising instructions that when executed, cause the processor to increase the adjustable refresh rate in response to an increased temperature from a previous temperature measurement.

16. The computer-readable medium of claim 13, comprising instructions that when executed, cause the processor to decrease the adjustable refresh rate in response to a decreased temperature from a previous temperature measurement.

17. The computer-readable medium of claim 13, wherein the solid state memory is a NAND solid state memory.

18. The computer-readable medium of claim 17, wherein the solid state memory is a flash-based solid state memory.

\* \* \* \* \*